United States Patent [19]
Nakasuji

[11] Patent Number: 6,110,626
[45] Date of Patent: Aug. 29, 2000

[54] SEGMENTED STENCIL MASKS WITH MAIN FIELD AND SIDE FIELDS CONTAINING COMPLEMENTARY SUBFIELDS, AND METHODS FOR USING SAME

[75] Inventor: Mamoru Nakasuji, Yokohama, Japan

[73] Assignee: Nikon Corporation, Tokyo, Japan

[21] Appl. No.: 09/111,451

[22] Filed: Jul. 8, 1998

[30] Foreign Application Priority Data

Jul. 8, 1997 [JP] Japan ................................ 9-196409

[51] Int. Cl.⁷ .................. G03C 5/00; G03F 9/00
[52] U.S. Cl. ............................. 430/30; 430/296
[58] Field of Search ................ 430/5, 296, 942, 430/30

[56] References Cited

U.S. PATENT DOCUMENTS 5,624,774  4/1997  Okino et al. ........................ 430/5
5,874,198  2/1999  Okino .................................. 430/296
5,935,744  8/1999  Nakajima ........................... 430/30

FOREIGN PATENT DOCUMENTS 8-69965  3/1996  Japan .

*Primary Examiner*—Christopher G. Young
*Assistant Examiner*—Saleha R. Mohamedolla
*Attorney, Agent, or Firm*—Klarquist Sparkman Campbell Leigh & Whinston, LLP

[57] ABSTRACT

Projection-transfer methods, and segmented masks for use with reduction projection-transfer apparatus and methods, are disclosed that permit formation of large-scale device patterns on a mask substrate having limited dimensions. The overall mask pattern is divided into multiple subfields. For each subfield, a determination is made as to whether to divide the subfield into complementary subfields, based on the configuration and dimensions of certain features in the subfields such as islands and peninsular features. All resulting undivided subfields, and one of the complementary subfields of all the divided subfields, are situated in a main field of the mask on a mask substrate. The remaining complementary subfields are situated in side fields flanking the main field.

12 Claims, 3 Drawing Sheets

6a $L_1$, D, 6b, $L_2$, $I_1$

6c, D, L

6d

6e

6f

SEGMENTED STENCIL MASKS WITH MAIN FIELD AND SIDE FIELDS CONTAINING COMPLEMENTARY SUBFIELDS, AND METHODS FOR USING SAME

FIELD OF THE INVENTION

This invention pertains to microlithography using an energy beam such as a charged particle beam, and stencil masks as used in such microlithography. More specifically, the invention pertains to "demagnifying" projection-transfer processes and apparatus in which a pattern defined by a segmented mask is projected, using the charged particle beam, onto a sensitive substrate (wafer, etc.), and to segmented masks used with such processes and apparatus.

BACKGROUND OF THE INVENTION

In projection-exposure methods and apparatus as used for microlithography, the pattern to be transferred to the substrate is defined on a mask or reticle. Transfer is normally effected using an "energy beam" such as a light beam (e.g., ultraviolet light, X-ray) or a charged particle beam (e.g., electron beam). When a charged particle beam is used, the mask is normally segmented, by which is meant that the mask "field" (usually coextensive with a single die) is subdivided into multiple mask "subfields" (portions of the mask field) that are individually exposed in an ordered fashion. The image of each mask subfield (i.e., the corresponding "transfer subfields") are aligned with each other to produce each die on the substrate. Subdividing the mask in such a way is necessary because conventional charged-particle-beam (CPB) optical systems cannot project an entire die in one "shot" while sufficiently controlling aberrations.

For pattern transfer using a charged particle beam, either a "stencil mask" or a "scattering mask" (also termed "membrane mask") can be used. In a stencil mask, the features (elements) of the pattern portion in the various mask subfields are defined in part by voids extending through the thickness dimension of the mask and in part by the intervening regions of the mask that are situated between the voids, in the manner of a conventional "stencil". The intervening regions of the mask typically comprise a thin CPB-scattering membrane made of, e.g., silicon.

Charged particles in the beam encountering the voids pass directly through the voids. Charged particles in the beam encountering the CPB-scattering membrane are scattered. Charged particles passing through the mask pass through a CPB projection-optical system to the sensitive substrate. The CPB projection-optical system includes an aperture defined by a stop. Charged particles that are scattered by the scattering membrane tend to be blocked by the stop and thus do not propagate to the sensitive substrate; charged particles passing through the voids tend to pass through the aperture to the sensitive substrate. Thus, an image of the features defined in the mask subfield is formed on the sensitive substrate.

With a stencil mask, certain pattern features can only be defined as a scattering region surrounded by a void. Such features are termed "island" features. However, with an island feature, the surrounding void leaves the surrounded scattering region without physical support. Hence, with a stencil mask, it is necessary to divide island features into two or more complementary subfield patterns that must be separately exposed onto the corresponding transfer subfield (hence, each such transfer subfield receives at least two separate exposures). A similar problem arises with a "peninsular" feature that is longitudinally extended in at least one dimension such that it has insufficient physical support over its length. Hence, with a stencil mask, a peninsular feature must also be transferred by two or more complementary subfield patterns requiring that the respective transfer subfield receive multiple exposures to complete transfer of the respective pattern segment.

A conventional scattering mask comprises a thin (e.g., 3 $\mu$m thick) membrane that defines regions (corresponding to pattern features) that scatter charged particles very effectively and other regions (analogous to the voids in a stencil mask) that scatter charged particles much less effectively. Charged particles passing through such a membrane form an image of the pattern on the wafer. Unlike a stencil mask as summarized above, a scattering mask normally does not require splitting of certain mask subfields into two or more subfields having complementary patterns.

However, with a scattering mask, approximately 10 to 30 eV of energy is lost whenever the charged particle beam passes through the membrane. Thus, approximately 20 eV of the energy of the incident charged particle beam is lost. Due in part to such problems, scattering masks exhibit certain characteristic phenomena such as increased chromatic aberration in the CPB projection-optical system.

With stencil masks that include complementary mask subfields, it is preferable that all the subfields, including the complementary ones, be located on the same mask. Such a configuration allows the mask pattern to be transferred with less alignment error and other problems than with masks in which complementary subfields are situated on separate masks (e.g., two masks).

The 4-gigabit DRAM represents the new standard in "chip" (die) size. The chip size of a 4-gigabit DRAM is about 18 mm×36 mmas formed on the wafer. The size of a stencil mask for such a die must include sufficient area to accommodate the chip size multiplied by the reciprocal of the demagnification factor (e.g., multiplied by 4), boundary regions (non-patterned regions) located between adjacent mask subfields to separate the mask subfields from one another, and any complementary subfields. Accommodating all these requirements can make it difficult to fit such a mask on a single 8-inch diameter wafer.

If the chip size of a device is even larger than that of a 4-gigabit DRAM, serious concerns are raised as to whether the respective mask can be fit on a 10-inch diameter wafer or a 12-inch diameter wafer.

SUMMARY OF THE INVENTION

In view of the foregoing, an object of the invention is to provide demagnifying projection-transfer methods, and masks for such methods, that permit highly accurate and high-throughput pattern transfer of devices having a large chip size using a mask formed on a surface having limited dimensions.

According to a first aspect of the invention, demagnifying projection-transfer methods are provided that employ a charged particle beam and a segmented stencil mask that is divided into multiple mask subfields. The mask subfields are "transferred" (individually irradiated by the charged particle beam and projection-exposed, with demagnification, one subfield at a time to form corresponding transfer subfields on a sensitive substrate). Because the mask is a stencil mask, certain of the mask subfields (i.e., a subpopulation of the mask subfields) individually define a feature that cannot or may not be fully or accurately definable on a single respective mask subfield due to inadequate physical support of the feature by the mask itself and/or cannot be reproduced on the corresponding transfer subfields using a single exposure. For each such mask subfield, a determination is made whether or not to divide the mask subfield into first and second complementary mask subfields. Such a determination results in some of the mask subfields being divided and others remaining non-divided. All the "non-divided" mask subfields and the "divided" mask subfields are formed on a single mask substrate.

According to a second aspect of the invention, demagnifying projection-transfer methods are provided in which a die pattern is divided into multiple mask subfields that are transferred, with demagnification, one mask subfield at a time to form corresponding transfer subfields on a sensitive substrate. A single segmented stencil mask is used that comprises multiple mask subfields. Mask subfields that define, e.g., island features and/or peninsular features are subject to a determination being made as to whether or not to divide individual such subfields into complementary subfields. Normally, all mask subfields defining island features are divided into respective complementary subfields. If a mask subfield includes a peninsular feature, the mask subfield is divided into complementary subfields if the peninsular feature in the subfield exhibits a L/D ratio (wherein D is the width of the peninsular feature at the base of the peninsular feature, and L is the length of the peninsular feature) greater than a predetermined threshold value. The L/D ratio is determined based on the number of subfields of the die having such features and on the maximal number of complementary subfields that can be accommodated on the mask.

According to a third aspect of the invention, demagnifying projection-transfer methods are provided that utilize a segmented stencil mask. The mask comprises multiple mask subfields that are transferred one subfield at a time, with appropriate demagnification, to form corresponding transfer subfields on a sensitive substrate. In configuring the stencil mask, a decision is made for each constituent subfield whether or not to divide the subfield into respective first and second complementary subfields. Such a decision is based in part on whether the number of complementary subfields that must be accommodated on the mask represents a mask area in excess of a predetermined portion of the overall mask area. Whenever the required number of complementary subfields is less than the maximal number that can be accommodated (as complementary subfields), all such subfields are subdivided regardless of the L/D ratio. Subdividing all such subfields reduces the Coulomb effect because each subfield receives substantially the same beam current.

According to another aspect of the invention, segmented stencil masks are provided, for use in CPB demagnifying projection exposure, that comprise multiple subfields. Each such mask comprises, on a single mask substrate, a first area comprising mask subfields that are not divided, and a second area comprising mask subfields that have been divided into first and second complementary subfields.

The foregoing and additional features and advantages of the invention will be more readily apparent from the following detailed description, which proceeds with reference to the accompanying drawings.

DETAILED DESCRIPTION

Figure 3:
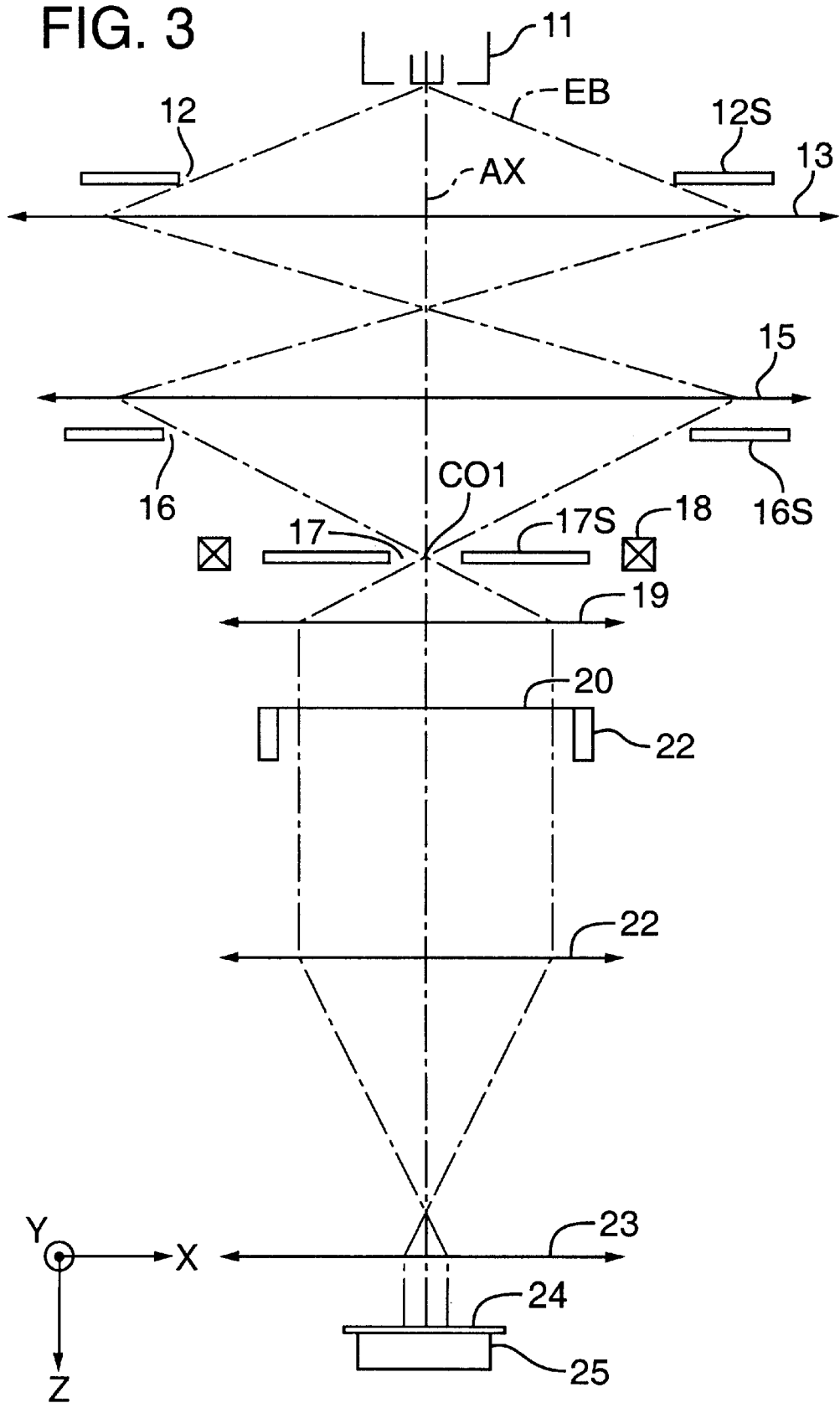
FIG. 3 is an elevational schematic diagram of a projection-transfer apparatus according to the invention, showing image relationships.

A demagnifying projection-transfer apparatus, employing an electron beam as a representative charged particle beam and employing a mask according to the invention, is shown in FIG. 3. The projection-transfer apparatus comprises an electron optical system exhibiting certain optical relationships as shown in FIG. 3. The apparatus comprises an electron gun 11 that produces an electron beam EB that propagates downward in the figure along an optical axis AX. The electron beam EB passes through first and second condenser lenses 13, 15 situated downstream of the electron gun 11. After passing through the condenser lenses 13, 15, the electron beam EB forms a first crossover CO1 at a blanking aperture 17 defined by a stop 17S, and then propagates to a mask 20. The two condenser lenses 13, 15 serve in concert as a zoom lens that allows the current density irradiated onto the mask 20 to be varied.

First and second apertures 12, 16, each defined by a respective stop 12S, 16S, are situated above and below the condenser lenses 13, 15, respectively. The apertures 12, 16 are each preferably rectangular in profile and serve as subfield-limiting apertures that define the dimensions of a region on the mask 20 irradiated by the electron beam EB. I.e., the apertures 12, 16 allow a transverse area of the electron beam to pass therethrough that is sufficient to illuminate one subfield on the mask. For example, the first aperture 12 shapes the electron beam to have a square profile sufficient to illuminate $(1 \text{ mm})^2$ of mask surface. An image of the first aperture 12 is formed on the second aperture 16 by the condenser lenses 13, 15.

A subfield-selection deflector 18 is situated downstream of the second aperture 16 preferably at the elevation of the first crossover CO1 and in line with the blanking aperture 17. The subfield-selection deflector 18 scans the electron beam in the X direction in FIG. 3 so as to sequentially illuminate all of the mask subfields in a main field of the mask.

A condenser lens 19 situated downstream of the subfield-selection deflector 18 collimates the electron beam EB and directs the electron beam EB at the mask 20. In the irradiated region on the mask 20, an image is formed of the second aperture 16.

Whereas only one mask subfield on the optical axis AX is shown in FIG. 3, the mask 20 actually extends perpendicularly to the optical axis AX (i.e., in the X-Y plane) and comprises multiple subfields and main fields (each main field comprising at least a row of subfields). For sequential irradiation and exposure of each mask subfield in a main field, the electron beam EB is selectively deflected by the subfield-selection deflector 18.

The mask 20 is mounted on a mask stage 21 that is movable in the X-Y plane. A sensitive wafer 24 is mounted on a wafer stage 25 that is also movable in the X-Y plane. By scanningly moving the mask stage 21 and the wafer stage 25 in opposite directions to one another along the Y direction, the subfields of a main field of the chip pattern are continuously exposed in a sequential manner. The various main fields are sequentially moved into position for exposure by moving the two stages 21 and 25 in the X direction. The respective positions of the stages 21, 25 in the X-Y plane are measured by respective position-measurement systems. Each position-measurement system preferably comprises one or more laser interferometers. The subfields on the mask 20 are individually projected to form respective transfer subfields on the wafer, but without any boundary regions. By various alignments and adjustments effected by use of deflectors, the corresponding transfer subfields and main fields are accurately "stitched" together on the wafer 24.

Electrons passing through an irradiated mask subfield carry an image of the irradiated mask subfield. A projection lens 22, an objective lens 23, and a deflector as required (deflector not shown) are situated downstream of the mask 20 and serve to irradiate the electron beam, carrying the image of the irradiated mask subfield, to form a respective transfer subfield on the wafer 24. Thus, a reduced-size (demagnified) image of the irradiated mask subfield is projected onto the corresponding transfer subfield on the wafer 24. The surface of the wafer 24 is coated with an electron-sensitive resist. Impingement of the electrons in the electron beam (carrying the image) on the resist causes imprinting of the image to form a respective transfer subfield.

A mask according to the invention typically comprises two types of subfields. A first type of subfield is termed an "undivided" subfield by which is meant a subfield in which all the features of the respective pattern portion can be transferred to the corresponding transfer subfield in one exposure; this generally means that the subfield lacks any island features or any peninsula features having an L/D ratio longer than a certain threshold. A second type of subfield is termed a "divided" subfield by which is meant that the subfield has a complementary counterpart on the mask; both complementary subfields must be exposed on the same transfer subfield to complete exposure of the transfer subfield. Divided subfields define respective pattern portions that include features such as islands and/or long peninsular features (e.g., having an L/D ratio exceeding a predetermined value). The term "divided" is used because a portion of the respective subfield pattern is defined by the first complementary mask subfield and another portion is defined by the second complementary mask subfield. Both complementary mask subfields are individually exposed onto the same location on the wafer.

Figure 1:
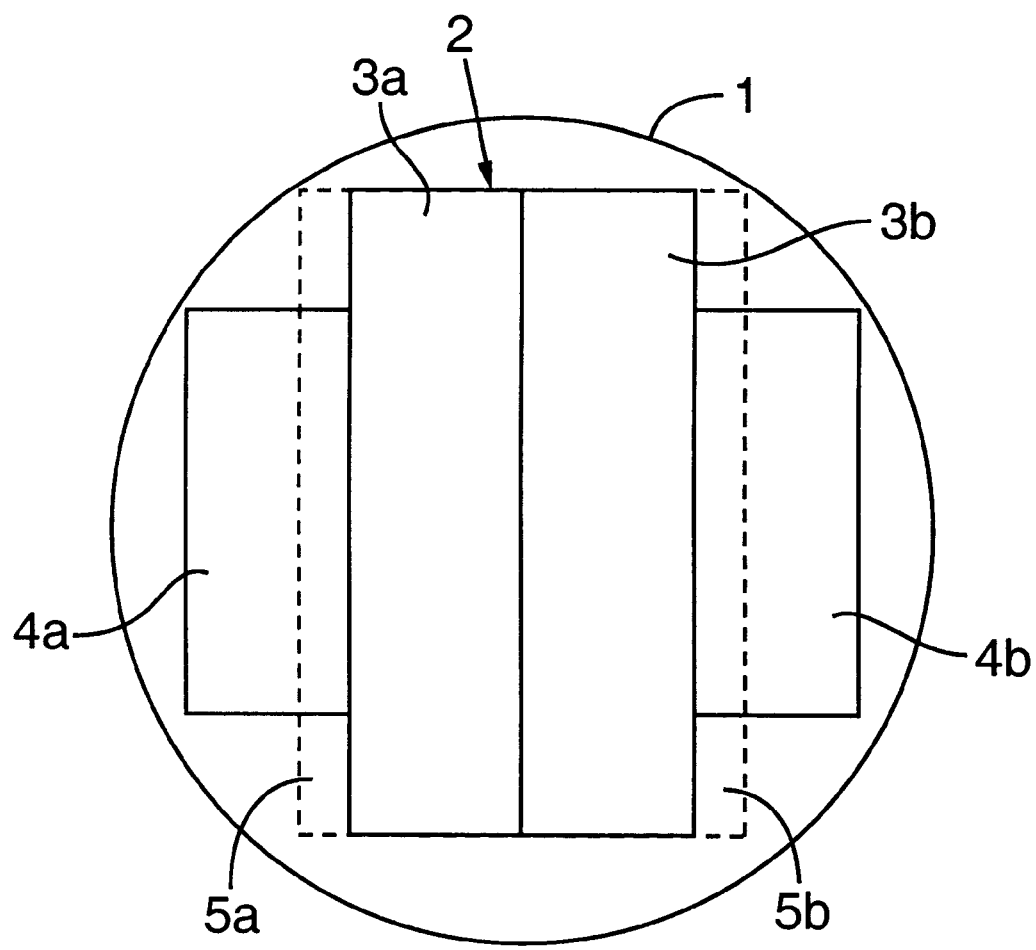
FIG. 1 is a plan view showing regions of a mask according to the present invention.

FIG. 1 is a plan view showing an arrangement of certain groups of mask subfields on the mask, according to Example Embodiment 1. In FIG. 1, the central region 2 (also termed a "main field") is vertically oriented on the mask substrate 1. The main field 2 is an area in which one chip's worth of undivided mask subfields and one of each of the "divided" subfields are located. The main field 2 is preferably divided into first and second sectors 3a, 3b, respectively.

By way of example, the mask is arranged on an 8-inch (203 mm) diameter Si mask substrate 1. If the chip size on the wafer is 18×36 mm and the demagnification ratio of the transfer apparatus is ¼, then the overall area of one chip's worth of subfields on the mask would measure at least 72×144 mm. The main field 2 must be at least this large in this example. However, the subfields in a segmented mask according to the example are individually surrounded by a boundary zone (preferably 0.12 mm wide so as to accommodate a 0.1-mm wide reinforcing strut and a 0.01-mm wide skirt flanking each strut). If each mask subfield is (1 mm)² in area, then including boundary zones in a chip size according to this example would result in the main field 2 measuring 80.5×161.3 mm. Referring to FIG. 1, such a main field 2 would be divided into two sectors 3a, 3b each measuring 40.3 mm wide. Continuing further with this example, each sector 3a, 3b, comprises multiple rows of subfields, each row containing 36 subfields.

The mask of FIG. 1 also comprises "side fields" 4a, 4b flanking the main-field sectors 3a, 3b, respectively. Each side field 4a, 4b preferably has the same width as the adjoining main-field sector 3a, 3b, respectively, and the length of each side field 4a, 4b is preferably at least 62% of the length of the main field 2. The side fields 4a, 4b contain the second complementary subfields of each of the respective first complementary subfields of each of the divided subfields in the main field 2.

By way of example, each side field 4a, 4b has the same width as the adjoining sector 3a, 3b, respectively, and has a length that is 62% of the length of the adjoining sector 3a, 3b, respectively. In the foregoing example in which each sector 3a, 3b had a width of 40.3 mm and a length of 161.3 mm, each side field 4a, 4b would thus measure 100 mm in length and 40.3 mm in width.

Whether or not divided subfields are required for certain mask subfields is determined for each main field. With a main field 2 that comprises divided subfields, one complementary subfield of each divided subfield is situated in a respective sector 3a, 3b of the main field 2 and the other complementary subfield is situated in the respective side field (e.g., side field 4a, 4b, respectively). By way of example, if the length of each side field (e.g.,side fields 4a, 4b, respectively) is 62% of the length of the main field 2 and the width of each side field is the same as the respective sectors 3a, 3b of the main field, then up to 62% of all the subfields of the mask pattern can be divided and still be accommodated on a single 8-inch diameter mask substrate.

According to another example, the side fields can have the same length as the sectors 3a, 3b of the main field 2. Such side fields are depicted in FIG. 1 as items 5a, 5b indicated as dashed lines to the left and right of the respective sectors 3a, 3b. By way of example, each sector 5a, 5b is 9.1 mm wide and 161.3 mm long. As described above, the side fields 5a, 5b contain the complementary subfields corresponding to the divided subfields in the respective sector 3a, 3b of the main field 2. If the side fields 5a, 5b are 9.1 mm wide (compared to 40.3 mm wide in the previous example), up to 22% of the subfields in the main field 2 can be divided and still fit all the mask subfields on a single substrate.

Figure 2A:
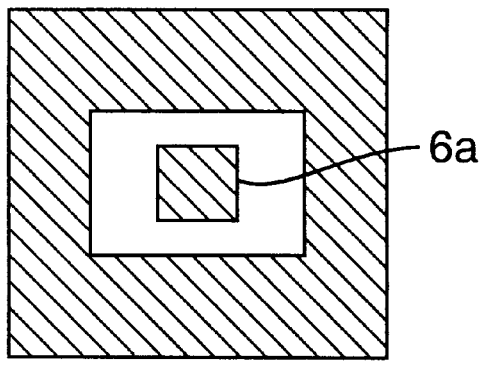
FIGS. 2(a)–2(f) show representative features that, if present in a mask subfield, may require that the subfield be divided into first and second complementary subfields according to the invention.
Figure 2B:
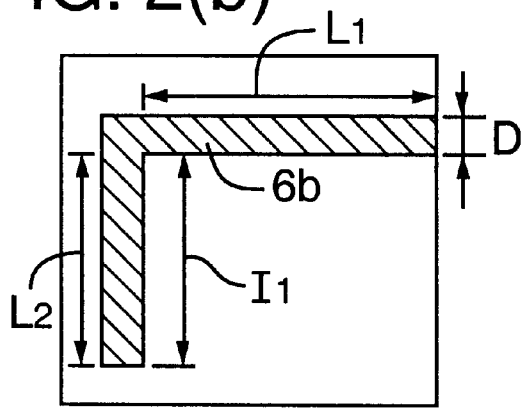
Figure 2C:
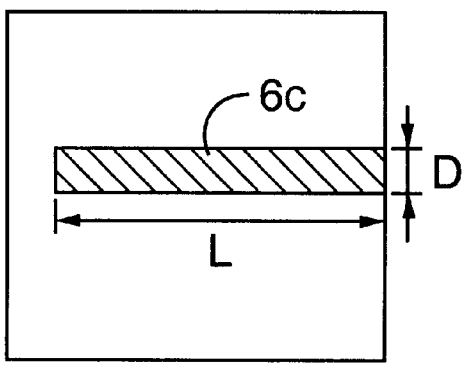
Figure 2D:
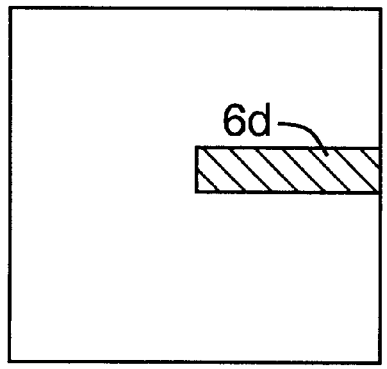

FIGS. 2(a)–2(f) are plan views of exemplary features that, if present in a mask subfield, would require or may require dividing the subfield into first and second respective complementary subfields. FIG. 2(a) depicts a representative island feature 6a that is not exposed onto the substrate. Thus, the island feature of FIG. 2(a) would require dividing the subfield. FIGS. 2(b), 2(c), and 2(d) depict peninsular non-exposed features 6b, 6c, 6d, respectively. If any of such features is present in a mask subfield, the subfield may have to be divided, wherein the presence of feature 6b would very likely require that the subfield be divided, the presence of feature 6c would pose a lower probability of having to divide the subfield than feature 6b, and the presence of feature 6d would pose a lower probability than feature 6c of having to divide the subfield.

Each peninsular feature 6b, 6c, 6d is supported at its respective right end; the connecting portion of the feature is termed herein the "base" of the feature. Determining whether or not to divide the respective subfield is performed, according to the invention, as follows. The determination is based on a ratio L/D between the width D (m) of the base and the dimension L (m) from the base to the distal terminus of the feature. In the case of bent features (e.g., feature 6b in FIG. 2(b)), L is equal to the lengths (e.g., $L_1+L_2$) of each portion of the feature. For example, with a feature 6b as shown in FIG. 2(b), L/D is a maximum of 2.000/0.4=5.000; L/D for feature 6c in FIG. 2(c) is 1.000/0.4=2.500; and L/D for feature 6d in FIG. 2(d) is 500/0.4=1.250.

Figure 2E:
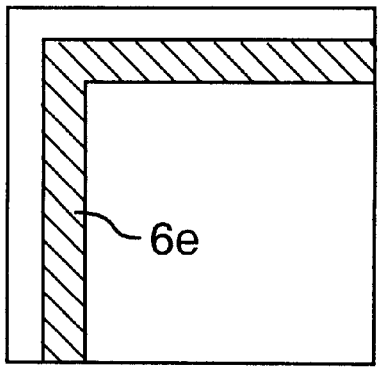
Figure 2F:
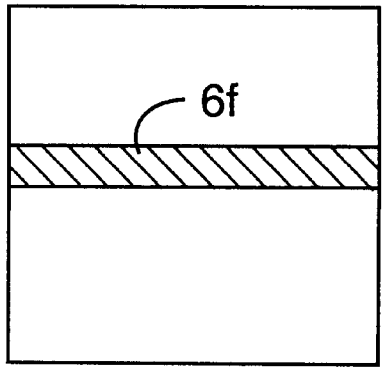

FIGS. 2(e) and 2(f) depict features 6e, 6f that are supported at both ends. Thus, the features 6e, 6f ordinarily pose a low probability that the respective subfields would need to be divided into complementary subfields.

In deciding whether or not to divide a subfield, a general principle is that subfields containing island features are divided first. Then, subfields containing peninsular features are divided next, starting with subfields containing features exhibiting the greatest L/D values. Dividing the subfields would cease after all the available space in the side fields is taken up with subfields complementary to corresponding subfields in the main field. All other subfields would remain as undivided subfields. For example, with the side fields 4a, 4b (FIG. 2) having 62% of the area of the main field 2, division of subfields would have to cease after 62% of the subfields had been divided.

The features of memory cells, which normally comprise the majority of the features of a memory chip (e.g., a DRAM) normally do not require that subfields containing such features be divided into complementary subfields. In such an instance, a mask comprising the main field 2 and side fields 5a, 5b (FIG. 2) would likely be sufficient. In other words, the size of each side field need be no larger than necessary to accommodate the desired number of complementary mask subfields, as dictated by the features of the mask pattern. This allows relatively large device patterns to be accommodated on a single mask substrate.

Therefore, the present invention provides demagnified projection-transfer methods and masks for use with a charged particle beam that are especially advantageous in forming a large-scale device pattern on a mask substrate having limited dimensions, and to perform highly accurate projection-transfer of such a pattern onto a substrate with high throughput.

In an alternative method a shaped beam is continuously scanned along a selected subfield, which is the minimum field element, and the size of the subfield is equal to the main field.

Whereas the invention has been described with reference to a preferred embodiment and multiple alternative embodiments, it will be apparent that the invention is not limited to those embodiments. On the contrary, the invention is intended to encompass all modifications, alternatives, and equivalents included within the spirit and scope of the invention as defined by the appended claims.

What is claimed is:

1. A method for projection-transferring, with demagnification, a pattern defined by a mask onto a sensitive substrate, the method comprising:

(a) providing a pattern divided into multiple subfields defining respective portions of the pattern, a subpopulation of the subfields individually defining at least one respective feature that cannot or may not be definable on a single respective mask subfield of a stencil mask;

(b) determining, for each subfield in the subpopulation, whether to divide the respective subfield into first and second complementary subfields;

(c) based on determinations made in step (b), dividing only those subfields requiring division, yielding a first population of undivided subfields and a second population of divided subfields, each divided subfield being represented in the second population by respective first and second complementary subfields;

(d) on a mask substrate, forming a mask comprising all the first and second populations of subfields; and (e) passing a charged particle beam individually through the subfields of the mask formed in step (d) to form corresponding transfer subfields on a sensitive substrate.

2. The method of claim 1, wherein, in step (a), each of the subfields in the subpopulation defines at least one feature selected from a group consisting of island features and peninsular features.

3. The method of claim 2, wherein each island feature comprises a portion that blocks transmission therethrough of a charged particle beam surrounded by a region that transmits the charged particle beam, and each peninsular feature comprises a portion, that blocks transmission therethrough of the charged particle beam, connected to another portion of the subfield at one location on the feature.

4. The method of claim 1, wherein, in step (a), each of the subfields in the subpopulation defines at least one feature that may not be sufficiently supported by a stencil mask to provide an accurate definition of the respective feature when projected onto a sensitive substrate.

5. The method of claim 1, wherein, in step (b), a determination is made to divide all subfields individually defining at least one island feature.

6. The method of claim 1, wherein, in step (b), a determination is made to divide all subfields individually defining at least one peninsular feature having a L/D ratio greater than a predetermined threshold value, wherein D is a base width of the peninsular feature and L is a length of the peninsular feature.

7. The method of claim 1, wherein, in step (d), the first population of subfields and the first complementary subfields of the second population of subfields are grouped into a main field on the mask substrate, and the second complementary subfields of the second population of subfields are grouped into a side field, separate from the main field, on the mask substrate.

8. The method of claim 7, wherein the second complementary subfields of the second population of subfields are grouped into first and second side fields flanking the main field on opposite sides of the main field.

9. The method of claim 7, wherein the subfields are shaped to have transverse profiles equal to transverse profiles of the main fields, and wherein a shaped beam is continuously scanned along the main deflection field on the mask.

10. The method of claim 1, wherein:

the mask substrate has a circular profile; and in step (d), the first population of subfields and the first complementary subfields of the second population of subfields are grouped into a main field centrally located on the mask substrate, and the second complementary subfields of the second population of subfields are grouped into a side field flanking the main field.

11. In a demagnifying projection-transfer method in which a pattern, defined by a segmented stencil mask divided into multiple mask subfields, is projected using a charged particle beam subfield by subfield onto a sensitive substrate, an improvement comprising:

(a) in configuring the segmented stencil mask, dividing each subfield that individually comprises at least one island feature into respective first and second complementary subfields;

(b) in configuring the segmented stencil mask, dividing each subfield that individually comprises at least one peninsular feature into respective first and second complementary subfields, based upon an L/D ratio of the respective peninsular feature in which D is a base width and L is a length of the respective peninsular feature, wherein subfields individually comprising a peninsular feature having the largest L/D ratio are divided, as well as subfields individually comprising a peninsular feature with a progressively lower L/D ratio, thereby leaving some non-divided subfields, until the number of divided subfields reaches a predetermined percent of the total number of subfields of the mask;

(c) fabricating the mask with all non-divided subfields and all divided subfields formed on a single mask substrate; and (d) performing projection-transfer of the mask pattern on a sensitive substrate using a charged particle beam.

12. In a demagnifying projection-transfer method in which a stencil mask pattern segmented into multiple subfields is used to define a pattern that is transferred subfield by subfield to a sensitive substrate using a charged particle beam in a demagnifying manner, an improvement comprising:

(a) when configuring the stencil mask, determining for each subfield whether or not it is necessary to divide the subfield into two complementary subfields, based on whether the subfield comprises a feature that cannot be supported as a stencil feature; and (b) further when configuring the mask, whenever the number of subfields that must be divided is greater than a predetermined proportion of the total number of subfields of the mask, dividing each of the subfields that must be divided into two complementary subfields, regardless of the determination performed in step (a);

(c) fabricating the mask with all constituent subfields on a single mask substrate; and (d) performing projection transfer using the mask.

* * * * *

UNITED STATES PATENT AND TRADEMARK OFFICE
CERTIFICATE OF CORRECTION

PATENT NO.   : 6,110,626
DATED        : August 29, 2000
INVENTOR(S)  : Mamoru Nakasuji It is certified that error appears in the above-identified patent and that said Letters Patent is hereby corrected as shown below:

<u>Column 7,</u>
Line 3, change "500/0.4 = 1.250." to -- 0.500/0.4 = 1.250. --

Signed and Sealed this

Sixteenth Day of October, 2001

Attest:

*Attesting Officer*

NICHOLAS P. GODICI
*Acting Director of the United States Patent and Trademark Office*